United States Patent

Wang et al.

[11] Patent Number: 5,882,985
[45] Date of Patent: *Mar. 16, 1999

[54] REDUCTION OF FIELD OXIDE STEP HEIGHT DURING SEMICONDUCTOR FABRICATION

[75] Inventors: Hsingya Arthur Wang, Saratoga; Yuan Tang, San Jose; Ming Sang Kwan, San Leandro, all of Calif.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 541,927

[22] Filed: Oct. 10, 1995

[51] Int. Cl.$^6$ ...................................................... H01L 21/76
[52] U.S. Cl. ............................................. 438/443; 438/697
[58] Field of Search ................................ 437/69, 70, 72; 148/DIG. 85, DIG. 86, DIG. 117; 438/443, 229, 230, 232, 697

[56] References Cited

U.S. PATENT DOCUMENTS

| | | | |
|---|---|---|---|
| 4,539,744 | 9/1985 | Burrow | 437/69 |
| 5,413,953 | 5/1995 | Chien et al. | |
| 5,472,905 | 12/1995 | Paek et al. | 437/69 |
| 5,554,560 | 9/1996 | Hsue et al. | 437/69 |

FOREIGN PATENT DOCUMENTS

| | | |
|---|---|---|
| 54-14165 | 2/1979 | Japan . |
| 56-30738 | 3/1981 | Japan . |
| 57-31164 | 2/1982 | Japan . |
| 1-244635 | 9/1989 | Japan . |
| 4-213828 | 8/1992 | Japan . |
| 6-252137 | 9/1994 | Japan . |

OTHER PUBLICATIONS

Deal, B.E., et al, "General Relationship for the Thermal Oxidation of Silicon", J.Appl.Phys., vol. 36, No.12, Dec. 1965, pp. 3770–3778.

*Primary Examiner*—George Fourson
*Attorney, Agent, or Firm*—Fliesler, Dubb, Meyer & Lovejoy

[57] ABSTRACT

A method for reducing the steep step at the edge of a locally oxidized, field oxide boundary region as a result of using the local oxidation of silicon (LOCOS) method to isolate the active regions of a semiconductor wafer. The reduction is carried out by applying a planarizing layer to the field oxide layer and then etching back the planarizing layer and field oxide layer to a desired thickness.

15 Claims, 2 Drawing Sheets

REDUCTION OF FIELD OXIDE STEP HEIGHT DURING SEMICONDUCTOR FABRICATION

FIELD OF THE INVENTION

The present invention relates to a method for reducing the step height of a field oxide isolation layer, adjacent to an active region, which is grown during the fabrication of a MOS device.

BACKGROUND OF THE INVENTION

In the microelectronics industry, the local oxidation of silicon (LOCOS) method is widely used for isolating MOS devices fabricated on a semiconductor substrate. By isolating the devices, the operational characteristics of the various components fabricated on the semiconductor substrate are enhanced by reducing or suppressing various parasitic mechanisms.

In the well-known LOCOS method, a layer of anti oxidant material is provided over a relatively thin pad oxide layer formed on a silicon substrate and etched into a mask which prevents the growth of field oxide over the masked active region of the substrate. After the anti-oxidant material has been grown, a field oxide region is grown on the substrate surface, adjacent the anti-oxidant material mask, doped with impurities, and then annealed to cause the field oxide to grow on the silicon surface in the non-masked areas, thus providing the isolation regions.

The field oxidation step results in the lateral diffusion of a thin, wedge-shaped portion of the oxide layer between the edge of the anti-oxidant material mask and the underlying thin pad oxide layer. This lateral diffusion of the field oxide between the mask and the substrate is known as "birds beak" encroachment. Birds beak encroachment reduces the total active area available for the formation of MOS devices. It also causes semiconductor stress and other faults that may result in the propagation of defects in subsequently formed layers during fabrication. Further, the relatively high temperature product of the field oxidation process permits the earlier doped field oxide impurities to diffuse beneath the active area. This diffusion may reduce the operational voltage threshold of the subsequently fabricated devices and increase the parasitic capacitance of the subsequently fabricated devices.

After oxidation, the anti-oxidant mask is removed thus leaving a steep step at the mask/field oxide interface. The step height of the remaining field oxide layer is approximately 50% of the total field oxide thickness. A step of this height causes several problems. One problem is that the step acts as a reflection surface during subsequent fabrication steps. This reflection surface promotes masking problems such as gate narrowing, which in turn results in current leakage from subsequently formed devices. A second problem is that the resulting oxide step interferes with film deposition during subsequent process steps, causing subsequently deposited film layers to be applied unevenly. A third problem associated with the oxide step height is that conventional fabrication techniques require extra etching steps to remove the excess amounts of polysilicon or silicide films at the field oxide/mask interface. The extra etching steps cause pitting of the substrate material, thereby damaging the substrate.

To reduce field oxide encroachment, conventional methods require the growth of a relatively thick layer of anti-oxidant material to mask the active areas of the substrate. However, the thick mask distorts the crystal structure of the underlying substrate abutting the edge of the mask, which can result in the propagation of imperfections through the substrate where devices are to be later fabricated.

It is therefore evident that there is a need for an improvement in the generally accepted MOS semiconductor device fabrication process which will reduce field oxide step height without introducing any unnecessary complexity to the standard fabrication process.

SUMMARY OF THE INVENTION

The present invention solves the aforementioned and related problems associated with standard MOS device fabrication techniques. The present invention discloses a method for reducing the step height of a field oxide isolation layer comprising the steps of masking an active region on a semiconductor substrate; implanting an isolation layer; depositing a planarizing layer; etching the planarizing layer and the isolation layer; and removing the mask.

An advantage of the present invention is the ability to reduce the step height of the field oxide isolation layer at the mask/field oxide interface.

Another advantage of the present invention is the ability to reduce the damage caused to the semiconductor substrate caused by etching.

A feature of the present invention is that it does not add any complexity to standard fabrication techniques and can be used along with standard semiconductor fabrication techniques.

BRIEF DESCRIPTION OF THE DRAWINGS

These and other advantages and features of the present invention will become apparent from the following description of the preferred embodiments, taken in conjunction with the accompanying drawings wherein like numerals represent like elements, in which.

DETAILED DESCRIPTION OF EMBODIMENTS

Figure 1:
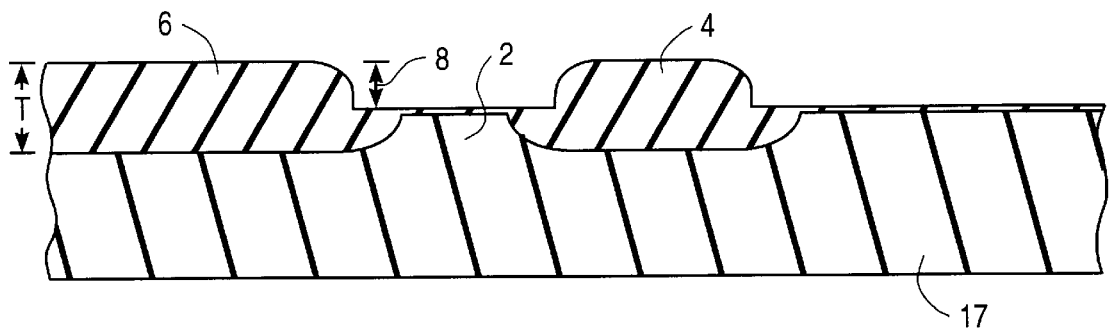
FIG. 1 illustrates a cross-sectional side view of a semiconductor device, fabricated with a conventional process, showing the step height of the field oxide layer.

FIG. 1 shows the steep field oxide step height resulting from performing conventional MOS semiconductor fabrication techniques. After the antioxidant or masking layer (not shown) is removed from the silicon substrate 17, the remaining structure has a locally oxidized, field oxide regions 4,6 having a very large step height 8. This step height can have a value up to 50% of the total field oxide thickness T. As discussed above, such a large step causes problems in subsequent fabrication steps, such as gate narrowing and pitting of the silicon substrate. The present invention is an improvement on the standard process whereby the step height of the locally oxidized, field oxide region 8 is removed before the subsequent fabrication of devices in the active area 2.

Referring now to FIGS. 2–6, the fabrication process of the present invention for reducing the field oxide step height will be described. While the embodiment described is directed to a p-type silicon semiconductor substrate it would be readily apparent to one skilled in the art that the same process can be used on an n-type silicon semiconductor substrate.

Figure 2:
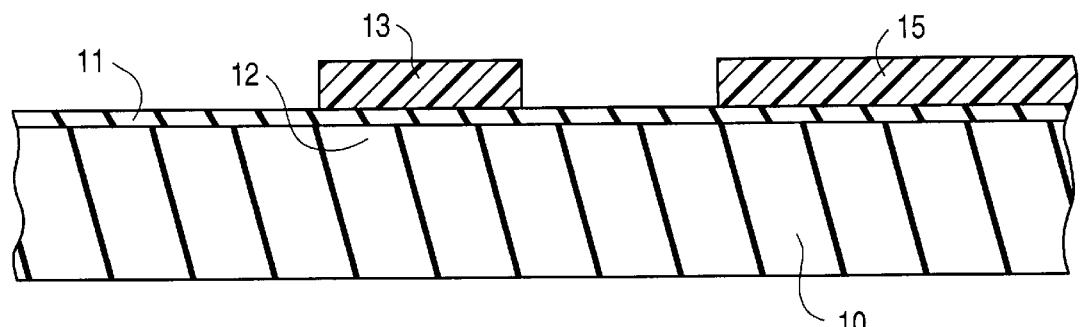
FIGS. 2–6 illustrate the process steps for reducing the oxide layer step height according to the present invention.
Figure 3:
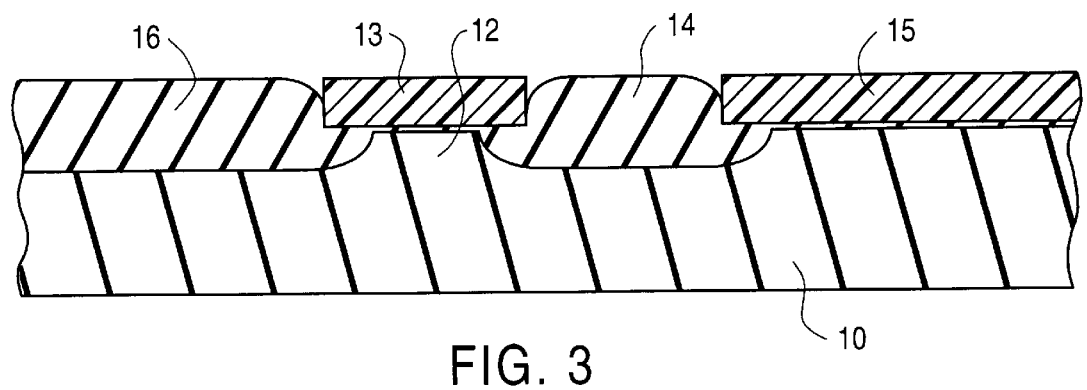

Referring to FIG. 2, the fabrication process is performed on a p-type silicon semiconductor substrate 10. Standard fabrication techniques are used to deposit an anti-oxidant layer, such as silicon nitride, on the semiconductor substrate 10 after the formation of a thin oxide layer 11. The anti-oxidant layer 13 is etched using standard techniques to establish a mask 13, 15 which is used to define an active region 12 on the semiconductor substrate 10. Oxide is then grown in the exposed portions of the silicon substrate 10 using conventional fabrication techniques and annealed at a temperature in the range of 1050° C.–1275° C., thus providing the LOCOS oxide isolation regions 14, 16 (FIG. 3) that do not have raised edges at the oxide/mask interface. The silicon nitride mask 13, 15 and the oxide isolation regions 14, 16 define a base structure.

Figure 4:
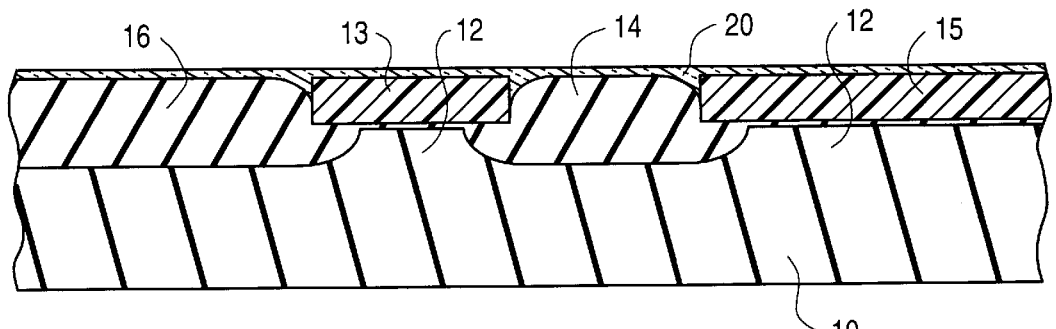
Figure 5:
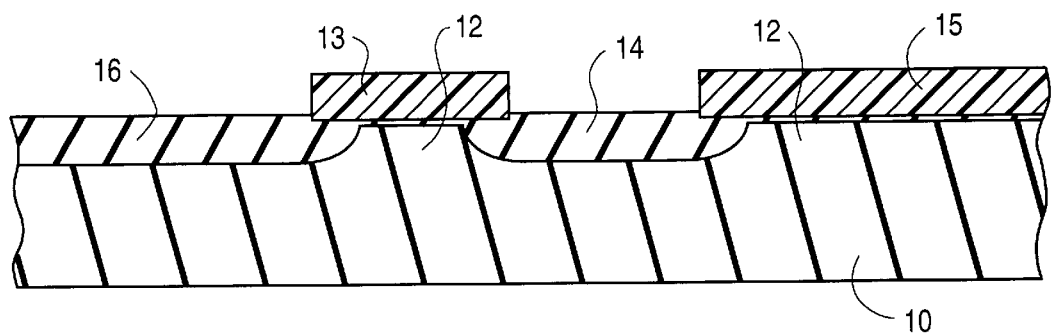

As shown in FIG. 4, a planarizing material such as spin-on glass or photoresist, having a thickness in the range of 200 Å–3,000 Å, is then applied to the base structure. The planarizing layer 20 allows plasma etching to be used to selectively etch the oxide isolation regions 14, 16 into a flat surface against the silicon nitride mask 13, 15. The selectivity requirement, which refers to the etch rate of the spin-on-glass and the oxide, is not fixed, but should be above 1.2, or more than 20 percent faster than the etch rate of silicon nitride. However, it is to be noted that the etch rate of the planarizing layer and the oxide are comparable and can be adjusted for any particular set of processing parameters. The silicon nitride mask 13 remains in place to protect the active area 12 of the silicon substrate 10 from any damage caused by the etching of the planarizing layer 20 and the locally oxidized, oxide isolation regions 14, 16.

After the oxide isolation regions 14,16 have been etched away (FIG. 5), the silicon nitride mask 13, 15 is stripped away using a hot phosphorus acid etchback process.

Figure 6:
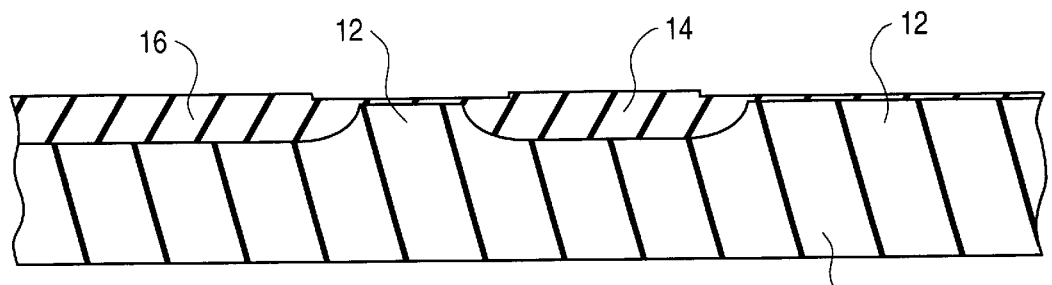

The resulting structure is shown in FIG. 6, where the step height of the locally oxidized, oxide isolation regions 14, 16 has been lowered to approximately the upper surface of the active area 12 (the bottom level of the silicon nitride layer 13, 15) without damaging the silicon substrate 10. By using the fabrication method of the present invention, the locally oxidized oxide isolation region 14, 16 separating the active device areas 12 on a semiconductor substrate can be formed without adding any unnecessary complexity to current fabrication processes.

The foregoing description of the preferred embodiment of the present invention has been presented for the purposes of illustration and description. It is not intended to be exhaustive or to limit the invention to the precise form disclosed, and obviously many modifications and variations are possible in light of the above teachings. The reduction of field oxide isolation step height was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method of fabricating a semiconductor device, comprising the steps of:
   (a) defining a base structure on a substrate, said base structure having an active area and at least one exposed substrate area;
   (b) forming an anti-oxidant mask on the active area of the base structure;
   (c) growing a field oxide layer on the at least one exposed substrate area;
   (d) applying a planarizing material to said base structure; and
   (e) performing a selective etch of said planarizing material, said field oxide layer and said anti-oxidant mask with a selectivity of above 1.2, said selectivity defined as the ratio of the etch rate of said planarizing material and said field oxide layer to the etch rate of said anti-oxidant mask.

2. A method of reducing the step height of a field oxide isolation layer in a semiconductor device, comprising the steps of:
   (a) applying a nitride layer on a semiconductor substrate, said semiconductor substrate having a top surface, said nitride layer defining an active region;
   (b) providing a field oxide layer on said semiconductor substrate, said field oxide layer situated to isolate said active region;
   (c) applying a planarizing layer on said field oxide layer and said nitride layer;
   (d) performing a selective etch of said planarizing layer, said field oxide layer and said nitride layer with a selectivity of above 1.2, said selectivity defined as the ratio of the etch rate of said planarizing layer and said field oxide layer to the etch rate of said nitride layer; and
   (e) removing said nitride layer, wherein said field oxide layer is etched to the top surface of said semiconductor substrate.

3. A method of reducing the field oxide step height in a semiconductor device, comprising the steps of:
   (a) applying an anti-oxidant mask on a semiconductor substrate, said mask defining an active region;
   (b) forming a field oxide layer by local oxidation of said semiconductor substrate, said field oxide layer including isolation regions situated to separate said active region;
   (c) forming a planarizing layer on said mask and said field oxide layer;
   (d) performing a selective etch of said planarizing layer, said field oxide layer and said anti-oxidant mask with a selectivity of above 1.2, said selectivity defined as the ratio of the etch rate of said planarizing layer and said field oxide layer to the etch rate of said anti-oxidant mask; and
   (e) removing said anti-oxidant mask.

4. The method of claim 1, wherein said anti-oxidant mask comprises a nitride layer.

5. The method of claim 4, wherein said nitride layer comprises a silicon nitride layer.

6. The method of claim 1, further comprising the step of removing said anti-oxidant mask.

7. The method of claim 1, wherein said planarizing material comprises spin-on glass.

8. The method of claim 1, wherein said planarizing material comprises photoresist.

9. The method of claim 2, wherein said nitride layer comprises a silicon nitride layer.

10. The method of claim 2, wherein said planarizing layer comprises spin-on glass.

11. The method of claim 2, wherein said planarizing layer comprises photoresist.

12. The method of claim 3, wherein said anti-oxidant mask comprises a nitride layer.

13. The method of claim 12, wherein said nitride layer comprises a silicon nitride layer.

14. The method of claim 3, wherein said planarizing layer comprises spin-on glass.

15. The method of claim 3, wherein said planarizing layer comprises photoresist.

* * * * *